United States Patent [19]

McDiarmid

[11] Patent Number: 5,148,714

[45] Date of Patent: Sep. 22, 1992

[54] ROTARY/LINEAR ACTUATOR FOR CLOSED CHAMBER, AND REACTION CHAMBER UTILIZING SAME

[75] Inventor: James McDiarmid, San Jose, Calif.

[73] Assignee: AG Processing Technology, Inc., Sunnyvale, Calif.

[21] Appl. No.: 602,750

[22] Filed: Oct. 24, 1990

[51] Int. Cl.[5] .................. F16H 29/02; C23C 16/00
[52] U.S. Cl. .................. 74/89.15; 118/725; 118/730; 219/390; 392/416
[58] Field of Search .................. 74/89.15; 422/186.05; 427/248.1; 118/724, 725, 728, 729, 730; 34/5; 219/411, 390, 405; 392/416, 418

[56] References Cited

U.S. PATENT DOCUMENTS

| | | | |
|---|---|---|---|
| 3,065,645 | 11/1962 | Musser | 74/89.15 X |
| 3,408,982 | 11/1968 | Capita | 118/730 |
| 3,424,628 | 1/1969 | Winings | 118/730 X |
| 3,805,629 | 4/1974 | Martin et al. | 74/89.15 |
| 3,859,535 | 1/1975 | Bartz | 422/186.05 |
| 3,862,397 | 1/1975 | Anderson et al. | 118/724 |
| 4,068,514 | 1/1978 | Chachin et al. | 74/89.15 X |
| 4,241,652 | 12/1980 | Smedlund | 74/89.15 X |
| 4,314,814 | 2/1982 | Deroode | 427/248.1 X |
| 4,536,419 | 8/1985 | Kubota et al. | 427/248.1 X |
| 4,739,669 | 4/1988 | Yokose et al. | 74/424.8 R X |
| 4,781,145 | 11/1988 | Amlinsky et al. | 98/115.3 X |
| 4,920,918 | 5/1990 | Adams et al. | 118/724 |
| 4,980,204 | 12/1990 | Fujii et al. | 118/724 X |
| 4,997,677 | 3/1991 | Wang et al. | 118/724 X |

FOREIGN PATENT DOCUMENTS

63-153185 12/1989 Japan .................. 118/724

Primary Examiner—Allan D. Herrmann
Assistant Examiner—Julie Krolikowski
Attorney, Agent, or Firm—Fliesler, Dubb, Meyer & Lovejoy

[57] ABSTRACT

A reduced pressure reaction chamber allows rotation of a workpiece, and translation of the workpiece along the axis of rotation, using a sealed rotate and translate actuator. The reaction chamber has rigid walls, and is particularly suited to reduced pressure systems. The actuator includes a shaft coupled through the wall of the chamber by a vacuum rotary feed-through mechanism. A sleeve is mounted over the shaft and coupled to the shaft by means of threads, and shaft seals, which provide a frictional coupling between the shaft and the sleeve. Due to the frictional coupling, the sleeve attains the same rotational velocity as the shaft. A clutch is provided, which engages the sleeve when linear translational motion is desired. The difference in rotational velocity of the shaft and the sleeve is translated into linear motion by the threads. The shaft seals, in addition to providing the frictional coupling, seal the actuator, and reduce contamination caused by such mechanism.

32 Claims, 5 Drawing Sheets

ROTARY/LINEAR ACTUATOR FOR CLOSED CHAMBER, AND REACTION CHAMBER UTILIZING SAME

CROSS REFERENCE TO RELATED APPLICATION

The present application is related to U.S. Patent Application entitled REACTION CHAMBER WITH CONTROLLED RADIANT ENERGY HEATING AND DISTRIBUTED REACTANT FLOW, Ser. No. 07/351,829, filed May 15, 1989, by inventors Wong, et al. This related application is now, and was at the time of invention, owned by the same Assignee as the present application.

FIELD OF THE INVENTION

The present invention relates to mechanisms for transmitting rotary and linear motion across a barrier, such as across a vacuum seal into an enclosed chamber used in vacuum systems, and to reaction chambers which utilize such mechanisms.

BACKGROUND OF THE INVENTION

In reduced pressure chemical vapor deposition reaction chambers, particulate contaminants within the reaction chamber can cause flaws in any deposition process. One source of particles arises from mechanical systems within the reaction chamber, such as actuators for supporting the workpiece on which the process is to take place. In complex systems, which require both elevation, or linear motion, of the workpiece, and rotation of the workpiece, these actuators typically require a rotary feed-through device for rotating a support member, and a vacuum bellows which allows linear motion of the workpiece and support member itself relative to the reaction chamber. Vacuum bellows are a notorious source of particulate contaminants in such systems. In addition, they cannot be purged effectively or cooled.

One system which utilizes the vacuum bellows in combination with rotary feed-through is illustrated in co-pending U.S. patent application Ser. No. 07/351,829, referred to above.

Figure 1:
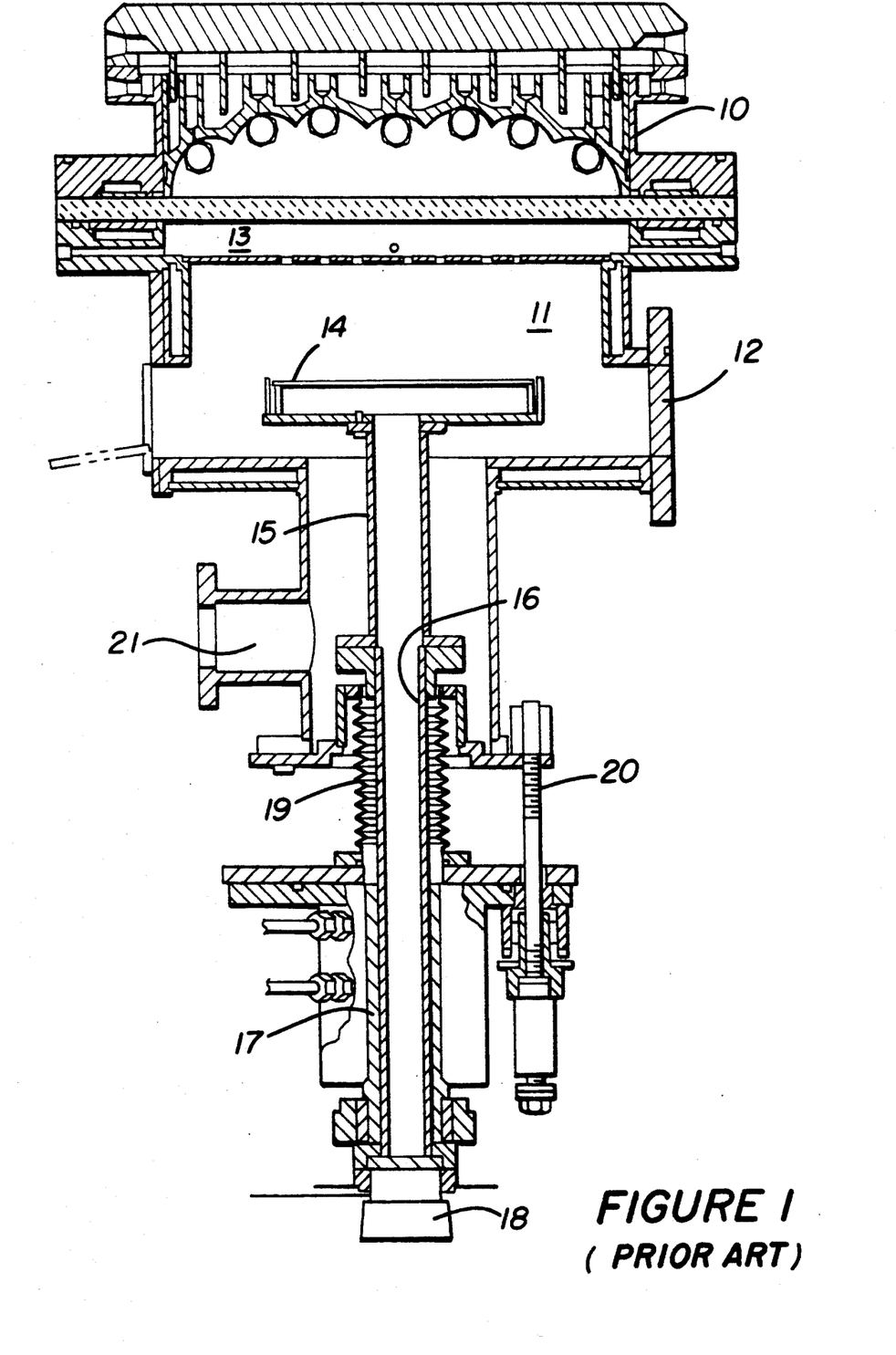
FIG. 1 is a schematic diagram of a reaction chamber with a prior art rotary/linear actuator.

FIG. 1 of the present application is a schematic diagram of a prior art rotary/linear actuator, such as used in the system disclosed in the cross-referenced application Ser. No. 07/351,829. FIG. 1 illustrates the chemical vapor deposition reaction apparatus of the cross-referenced application which includes a lamp housing 10 which generates reaction energy for supply into a reaction region 11 of the reaction chamber 12. Reaction gases are supplied into plenum 13 and from plenum 13 into the reaction region 11. A workpiece 14 is mounted on a support member 15, which orients the workpiece in the reaction region 11 to receive the reaction energy and the flow of reaction gases. The support member is mounted to a rotatable shaft 16 which is coupled to a rotary feed-through mechanism 17, such as a rotary feed-through, such as commercially available from Ferro-fluidic Inc. A motor 18 is used to control the speed of rotation of the workpiece 14. In this embodiment, the shaft 16 is hollow.

In order to position the workpiece 14 linearly within the reaction region 11, a vacuum bellows 19 is formed on the wall of the reaction chamber. The reaction region 11 is moved up and down with respect to the workpiece 14 by means of ball screws 20. Only one ball screw 20 is shown in this diagram for simplicity.

In this system using a prior art actuator design, particles escape from the rotation and translation mechanism, and particularly from the bellows 19, into the reaction region 11 of the reaction chamber 12.

This reaction chamber 12 is a reduced pressure reaction system, having an exhaust outlet 21 which is coupled to vacuum pump to remove exhaust gases and gas borne particles from the system. The exhaust system however does not completely prevent contamination of the workpiece 14.

Accordingly, it is desirable to provide a rotary/linear actuator which eliminates the necessity of vacuum bellows, and otherwise reduces particulate contaminates in the reaction apparatus. Also, it is desirable to provide a rotary/linear actuator which can be cooled and purged.

SUMMARY OF THE INVENTION

The present invention provides an apparatus for providing rotation and translation of an object across a barrier. The apparatus includes a shaft, and a mechanism connected to the shaft through the barrier for feeding rotational motion through the barrier to induce a rotational velocity on the shaft. A sleeve is mounted over the shaft and coupled to the object to be moved. A frictional coupling between the shaft and the sleeve provides an engaging force so that normally the sleeve achieves a rotational velocity in response to the rotational velocity of the shaft. A controllable brake, operable from across the barrier is used to overcome the engaging force between the sleeve and the shaft to inhibit rotation of the sleeve when translational motion is desired. A mechanism, such as threads on the sleeve and the shaft, translates a difference in the rotational velocities of the sleeve and the shaft into linear motion of the sleeve, and thereby of the object to be moved. The threaded regions on the sleeve and the shaft are sealed to prevent particles from escaping the area between the shaft and the sleeve.

According to another aspect, the present invention is a reaction chamber, such as used for chemical vapor deposition. The reaction chamber includes a reaction region into which reaction energy is supplied. Also, a flow of reactants, such as a mixture of chemical vapor deposition gases, is flowed into the reaction region. A support member for the workpiece is mounted within the reaction chamber. The actuator for rotating and elevating the workpiece, as described above, is mounted with the reaction chamber. Finally, an exhaust port is mounted between the structure for rotating and elevating the workpiece, and the reaction region of the chamber, and coupled to a pump for pumping gases from the reaction region and gas borne particles released by the actuator for rotating and translating, out of the reaction chamber.

According to another aspect of the invention, a reduced pressure reaction chamber is provided in which the workpiece can be rotated about an axis of rotation, and moved along the axis of rotation by means of a sealed rotate and translate actuator. In this system, the reaction chamber has rigid walls, which eliminates the necessity for a vacuum bellows type structure.

According to yet another aspect, the frictional coupling between the shaft and the sleeve comprises a shaft seal, which also provides the function of sealing the threaded area on the shaft and sleeve, from the reaction chamber.

Another aspect of the present invention arises from the ability to cool the actuator. By cooling the actuator, formation of deposits due to the reaction process or its by-products is prevented, eliminating a troubling source of contaminates.

It is found that the actuator, according to the present invention, when used with a reduced pressure reaction chamber for chemical vapor deposition, produces fewer particulate contaminants in the reaction region than prior art systems, and overall provides a simpler, easier to use, and more compact system for positioning a workpiece within the reaction chamber.

Other aspects and advantages of the present invention can be seen upon review of the figures, the detailed description, and the claims which follow.

DETAILED DESCRIPTION

Figure 2:
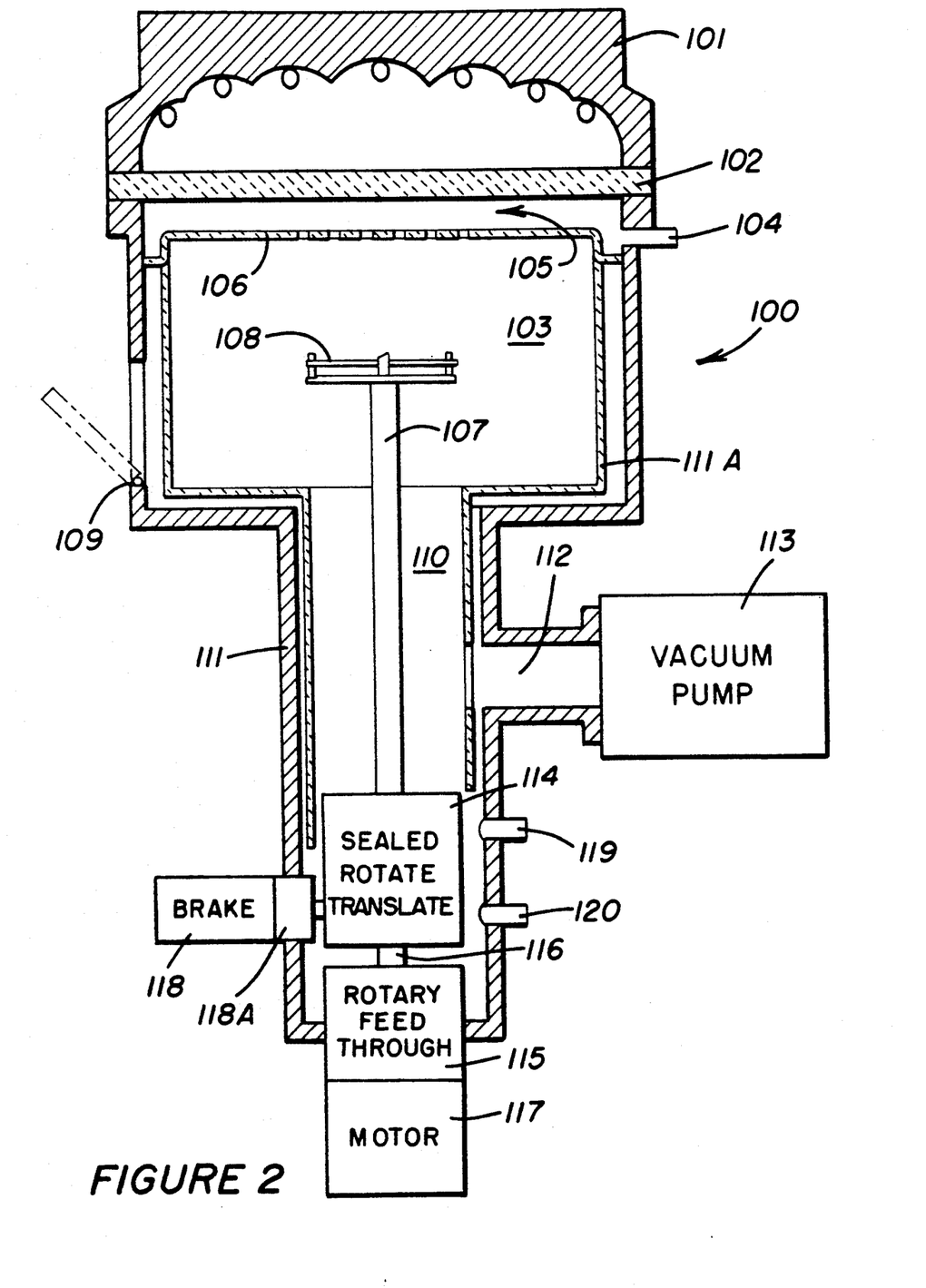
FIG. 2 is a schematic diagram of a reaction chamber according to the present invention.
Figure 3A:
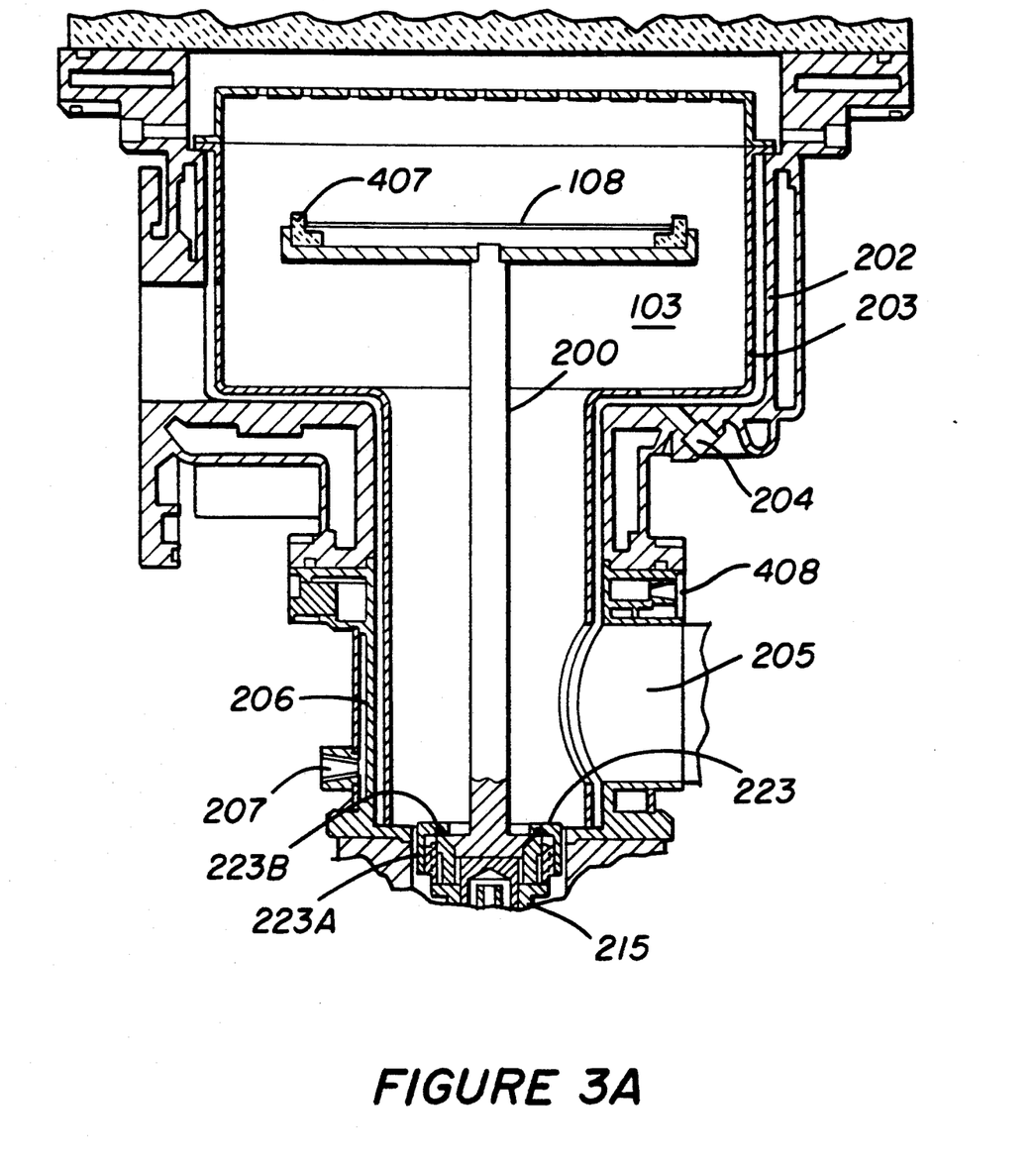
FIGS. 3A and 3B provide a diagram of a preferred rotary/linear actuator according to the present invention.
Figure 3B:
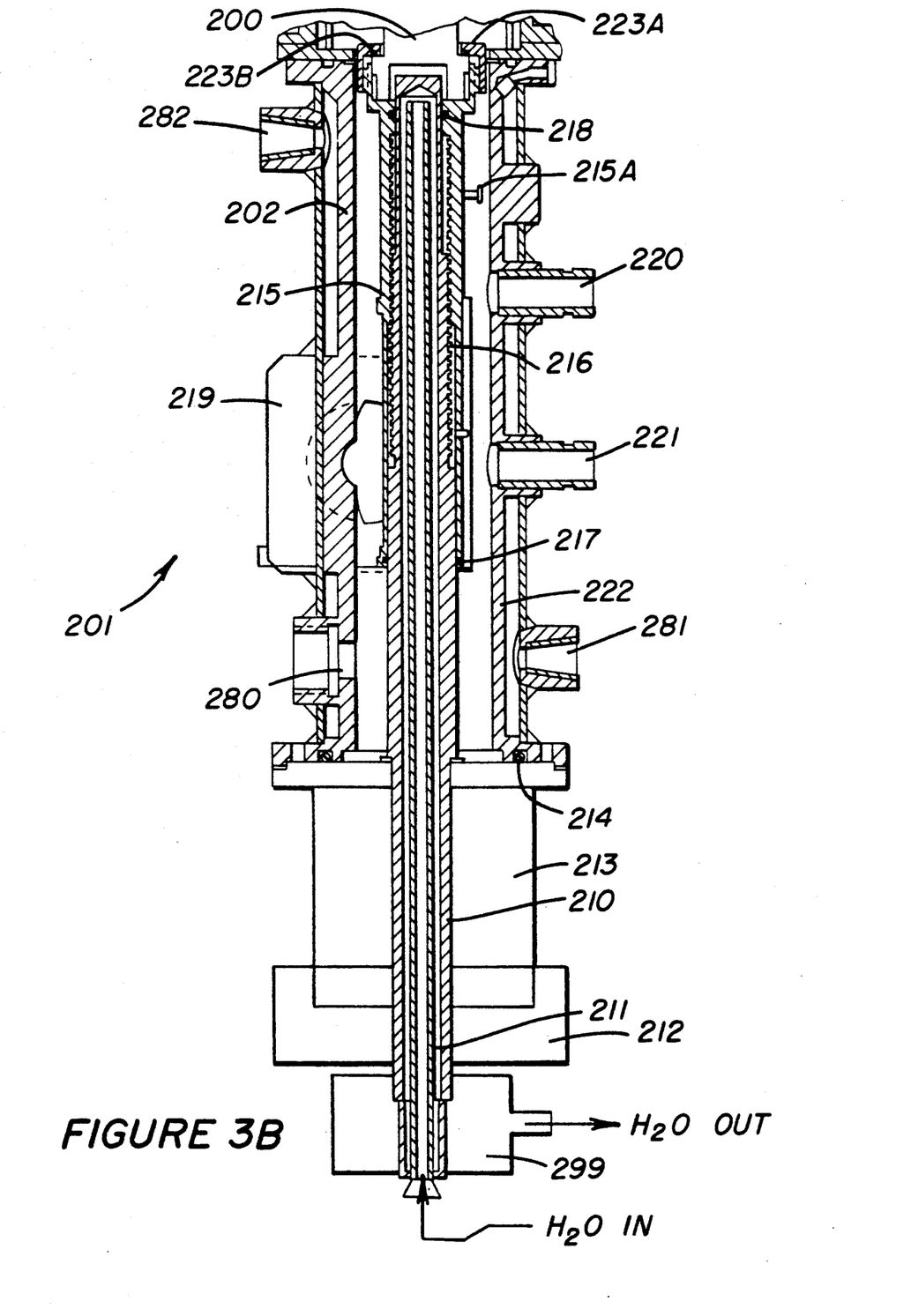
Figure 4:
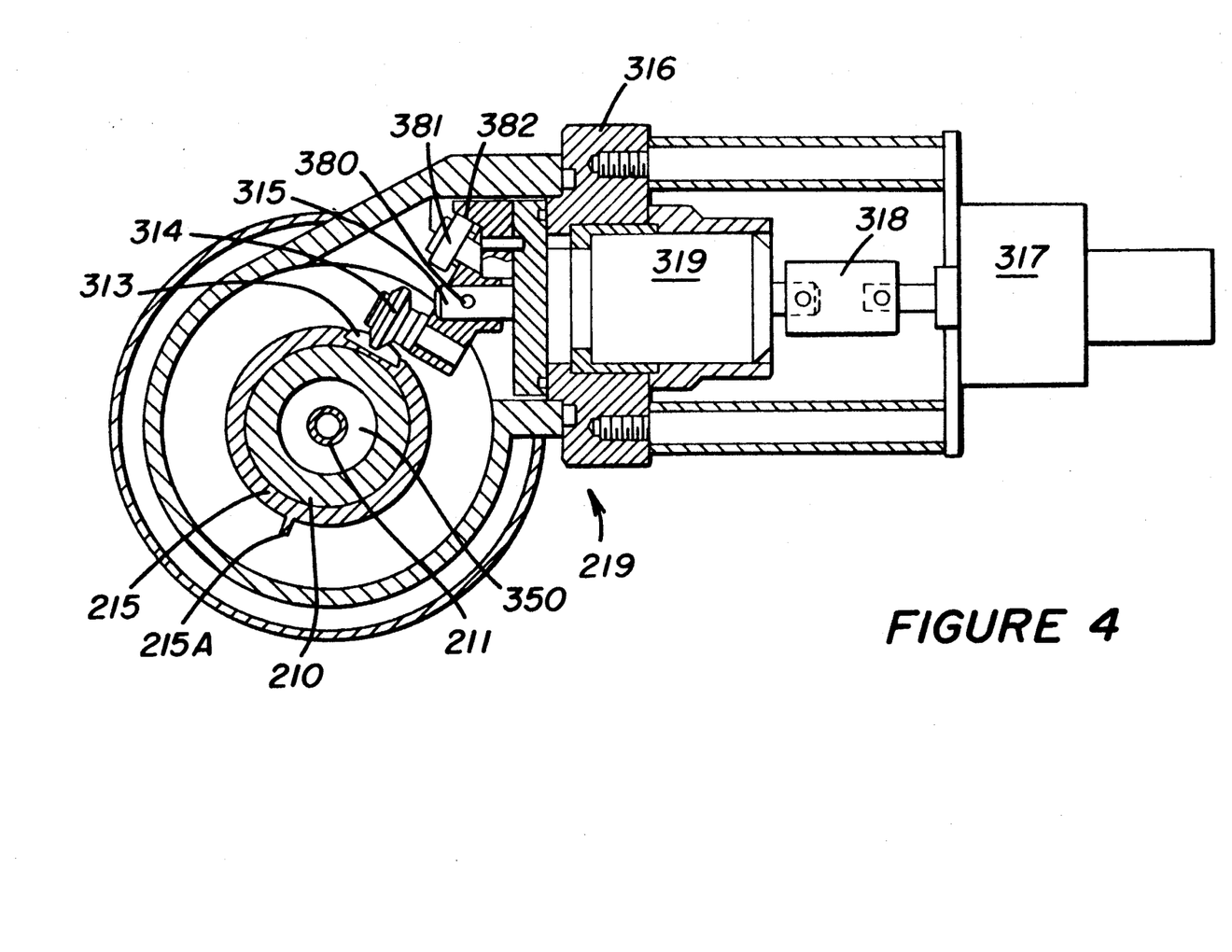
FIG. 4 is a diagram of the brake used with the system of FIGS. 3A and 3B.

A detailed description of preferred embodiments of the present invention is provided with reference to FIGS. 2-4. FIG. 2 is a schematic diagram of a reaction chamber with the rotary/linear actuator according to the present invention. FIGS. 3A, 3B, and 4 provide details of the preferred actuator and brake.

In FIG. 2, a reduced pressure chemical vapor deposition reaction chamber, generally referred to by the reference number 100, is illustrated. The reaction chamber 100 includes a lamp housing 101 mounted over a quartz window 102 for supplying reaction energy into a reaction region 103 of the reaction chamber. Reaction gases are supplied through nozzle 104 into plenum 105, and through perforations in a shower head 106 into the reaction region 103. A support member, schematically illustrated at 107, supports a semiconductor wafer or other workpiece 108 in the reaction region 103. The gate 109 is operated to allow movement of workpiece 108 into and out of the reaction chamber.

The support member 107 extends into a narrowed neck region 110 of the reaction chamber. The walls 111 in the neck region are formed of rigid material, such as stainless steel and are lined with quartz 111A. An exhaust port 112 opens into the neck region 110 in the rigid walls 111 of the reaction chamber. The vacuum pump 113 draws exhaust gases from the reaction region 103 through the neck region 110, and is used to establish reduced pressure within the reaction chamber.

The support member 107 further extends down to a sealed rotate-translate actuator 114. The actuator 114 is connected to a rotary feed-through 115 by shaft 116. A motor 117 outside the reaction chamber is controlled to provide force for rotating and translating the support member 107. Sealed brake 118 is coupled by means of a rotary feed-through 118A through the walls 111 of the reaction chamber to control operation of the sealed rotate-translate actuator 116. When the brake 118 is engaged, linear translation of the support member 107 is accomplished so that the system operates as an elevator of the workpiece 108. When the brake 118 is disengaged, the sealed rotate/translate mechanism 116 rotates the support member 107, and thereby the workpiece 108. Sensors 119 and 120, such as optical sensors, are mounted in the wall 111 of the reaction chamber, and used for sensing the position of the support member 107, to provide precise control of the elevation of the workpiece 108, and other information as necessary.

The characteristics of this reaction chamber 100 include rigid walls 111 in the neck region, a sealed mechanism for rotating and translating the support member 107, which reduces particulate contamination from the actuator 114, and an exhaust port 112 between the actuator and the reaction region 103 of the reaction chamber. This provides a clean, compact reaction chamber, with the ability to rotate and elevate the workpiece 108 as desired.

FIGS. 3A and 3B provide a detailed diagram of the rotate/translate actuator in the reaction chamber according to the present invention.

FIG. 3A shows the workpiece 108 schematically with registration ring 407 on support member 200. The support member 200 is mounted by threaded collar 223A with 0-ring 223B to sleeve 215 of the rotate/translate mechanism 201, shown in FIG. 3B. The support member 200 is made of quartz to minimize thermal conduction.

The walls 202 of the reaction chamber are illustrated having channels for flow of cooling fluid. In addition, the walls are lined with a removable quartz liner 203 to reduce deposition on the walls 202 due to the chemical reaction process.

A pyrometer 204 is mounted in the wall 202 in the reaction region 103, for the purposes of monitoring the temperature and other characteristics of the workpiece 108. A port (not shown) for a thermocouple sensor is added to a preferred system. Also, ports (not shown) are provided for $H_2$ purging between the liner 203 and wall 202 of the chamber.

The exhaust port 205 is mounted in the neck region of the reaction chamber. Again, the walls 206 in the neck region are fluid cooled and have channels shown for the purposes of flowing cooling fluid. Also, inlet fitting 207 is used to supply cooling fluid into the channels in the walls 206. Fitting 408 provides a channel for return flow of cooling fluid.

FIG. 3B illustrates the details of the rotary/linear actuator 201. The actuator 201 includes a shaft 210 having a hollow core, and a central tube 211. Cooling fluid is flowed inside the hollow core 210 through the tube 211, back along the walls of the shaft, and out through a rotary water feed-through 299 such as manufactured by Deublin.

The shaft 210 is coupled to a precision controlled motor 212 which is controlled to provide rotation and positioning of the shaft inside the reaction chamber. The shaft is mounted with a rotary feed-through device 213, such as a Ferro-fluidic rotary feed-through, which allows for translation of the rotational motion across the base wall 214 of the reaction chamber without compromising the low pressure within the chamber.

A sleeve 215 is mounted over the shaft 210 inside the reaction chamber. Threads 216 on the sleeve and the shaft secure the sleeve on the shaft. In addition, frictional couplings, formed by shaft seals 217 and 218, such as ball seals, seal the region between the sleeve and the shaft from the reaction chamber. A minute vent, not shown, is provided in the sleeve to prevent formation of a trap within the vacuum chamber, without compromising the benefit of containing particles provided by the seals 217, 218. The frictional coupling caused by the seals 217 and 218 causes the sleeve 215 to achieve normally the rotational velocity of the shaft 210. Although the seals 217, 218 provide both functions of frictional coupling and sealing in the preferred system, these functions could be provided by independent mechanisms, if necessary, for a given design.

The seals 217, 218 are manufactured using teflon, or elastomers, as known in the art. The shaft 210 and sleeve 215 are preferably manufactured of stainless steel, or other hard vacuum quality materials.

A brake 219, and shown in more detail in FIG. 4, is used to mechanically engage the sleeve 215 when linear or translational motion of the workpiece 108 (FIG. 3A) is desired. When the brake 219 engages the sleeve 215, the threads 216 translate the difference in rotational velocity of the shaft 210 and the sleeve 215, into linear motion of the sleeve 215.

Although the preferred system uses threads 216 for translating rotary into linear motion, other devices like ball screws, gears, cams, etc., can be used as suits the needs of a particular design.

Sensors 220 and 221 such as optical sensors, are mounted through the walls 222 of the reaction chamber. The sensors are used to detect the position of the sleeve 215 and allow for precise computer control of the elevation of the workpiece 108. In order to provide highly accurate position sensing, flags (e.g. 215A) could be placed on the sleeve 215, which indicate speed of rotation, orientation, or height of the sleeve.

Also coupled to the neck region of the reaction chamber is an inlet 280 for use in hydrogen gas purging of the neck region near the actuator 201. Also, cooling inlets 281 and 282 are used to provide a flow of cooling fluid next to the wall 202 of the reaction chamber.

The reaction chamber ends at seal 214 coupled to the rotary feed-through 213.

The brake assembly 219 is illustrated in more detail in FIG. 4. FIG. 4 is a cross-section taken through the actuator at the brake 219. The shaft 210 is shown with its interior tube 211, and the region 350 between the tube and the shaft wall for flowing cooling fluid. The sleeve 215 is also shown in cross-section. The sleeve 215 includes a grooved plate 313 for engaging a brake roller 314. The brake roller 314 is mounted on a roller support 315 coupled by pin 380 on a rotary feed-through device 319, and through coupling 318 to rotary actuator 317. The assembly is secured to the reaction chamber by member 316.

To engage the sleeve 215, the roller support 315 is turned so that the brake roller 314 mechanically engages the grooved plate 313. To release the sleeve 215, the brake roller 314 is rotated so that it does not engage the flat grooved plate 313. The roller support 315 includes back roller 381 which rides against a curved wall 382 while the brake roller 314 engages the grooved plate 313. This back roller 381 reduces the side loading on the rotary feed-through device 319.

In the preferred system, the brake roller 314 is manufactured using a high quality clean, smooth vacuum material, such as the plastic vespel, and designed to engage a V-shaped groove in groove plate 313. To engage and disengage the brake, in the preferred system, the position of flag 215A is monitored. The motor slowly rotates the shaft and sleeve until the position of flag 215A indicates that the groove in plate 313 is aligned with the brake roller 314. When aligned, the brake roller 314 is engaged by operating the actuator 317. Because of the V-shaped groove, the brake roller is self-centering. To disengage, the motor is turned off to relieve load on the brake roller 314. Then it is rotated by 90° to allow rotation of the sleeve.

Of course, a wide variety of other mechanisms could be used for engaging the sleeve 215 to establish a difference in rotational velocity between the sleeve 215 and the shaft 210. For instance, rather than a grooved plate 313, one might have a flat surface along the sleeve 215, and use a cam for engaging the flat surface. Also, brake mechanisms which simply slow down the rotation of the sleeve relative to the shaft might be used.

The rotation and translation mechanism of the present invention offers the additional advantage that the moving parts, including the registration ring 407, the support structure 200, and the sleeve 215, can be easily removed for cleaning, repair, or replacement, without dismantling the reaction chamber. In particular, the top of the chamber is removed by taking off the lamp housing 101, the window 102, and the shower head 106 (see FIG. 2). The brake is engaged and the sleeve rotated until it is driven off of the threaded region of the shaft, which defines a range of translation. At that point, the workpiece assembly disengages from the shaft, and it can be lifted out of the reaction chamber. While out of the chamber, it can be cleaned or repaired or otherwise worked on. To re-install the assembly, you simply place the sleeve over the shaft and use the motor to move it back to its desired position. This allows installation and removal of the moving parts of the actuator without breaking the vacuum integrity of the mechanism, such as by removing the rotary feed-through or providing additional joints in the reaction chamber to facilitate removal of a rotation and translation mechanism.

In sum, a reduced pressure reaction chamber with rigid walls, and a sealed rotation and elevation apparatus has been provided, which allows for reactions to proceed relatively free of contaminants. In addition, the actuator can be cooled and purged while in place on the reaction chamber.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. It is intended that the scope of the invention be defined by the following claims.

What is claimed is:

1. An apparatus for generating rotational and translational motion of an object through a barrier; comprising:

a shaft;

a feedthrough, coupled to the shaft, for feeding motion through the barrier to induce a rotational velocity to the shaft;

a sleeve, mounted over the shaft and coupled to the object;

engaging means, coupled to the shaft and to the sleeve, for providing an engaging force between the sleeve and the shaft so that normally the sleeve achieves a rotational velocity in response to the rotational velocity of the shaft;

controllable means, coupled to the sleeve, for overcoming the engaging force between the sleeve and the shaft to inhibit rotation of the sleeve so that sleeve achieves a reduced rotational velocity; and translating means, coupled to the shaft and the sleeve, for translating a difference in the rotational velocities of the sleeve and the shaft into translational motion of the sleeve.

2. The apparatus of claim 1, wherein the engaging means comprises a frictional coupling.

3. The apparatus of claim 2, wherein the frictional coupling comprises a shaft seal.

4. The apparatus of claim 1, wherein the controllable means includes means for mechanically engaging the sleeve to prevent rotation of the sleeve.

5. The apparatus of claim 1, wherein the translating means includes threads on the shaft and matching threads on the sleeve.

6. The apparatus of claim 1, further including a seal on the translating means to prevent particles from escaping.

7. The apparatus of claim 1, wherein the engaging means comprises a frictional coupling which seals the translating means to prevent particles from escaping.

8. The apparatus of claim 7, wherein the frictional coupling comprises a shaft seal.

9. An apparatus for rotating and translating a workpiece within a closed chamber, comprising:
   a support structure for supporting the workpiece within the closed chamber;
   a shaft inside the closed chamber;
   a feedthrough, coupled to the shaft, for feeding motion into the closed chamber to induce a rotational velocity of the shaft;
   a sleeve, mounted over the shaft and coupled to the support structure;
   engaging means, coupled to the shaft and to the sleeve, for providing an engaging force between the sleeve and the shaft so that normally the sleeve and the support structure achieve a rotational velocity in response to the rotational velocity of the shaft;
   controllable means, coupled to the sleeve and controllable from outside the closed chamber, for overcoming the engaging force between the sleeve and the shaft to inhibit rotation of the sleeve; and
   translating means, coupled to the shaft and the sleeve, for translating a difference in the rotational velocities of the sleeve and the shaft into translating motion of the support structure.

10. The apparatus of claim 9, wherein the engaging means comprises a frictional coupling.

11. The apparatus of claim 10, wherein the frictional coupling comprises a shaft seal.

12. The apparatus of claim 9, wherein the controllable means includes means for mechanically engaging the sleeve to prevent rotation of the sleeve.

13. The apparatus of claim 9, wherein the translating means includes threads on the shaft and matching threads on the sleeve.

14. The apparatus of claim 9, further including a seal on the translating means to prevent particles from escaping into the closed chamber.

15. The apparatus of claim 9, wherein the engaging means comprises a frictional coupling which seals the translating means to prevent particles from escaping into the closed chamber.

16. The apparatus of claim 15, wherein the frictional coupling comprises a shaft seal.

17. A reduced-pressure reaction apparatus, comprising:
   a reaction chamber including a reaction region within the reaction chamber;
   an energy input, mounted with the reaction chamber, for supplying reaction energy into the reaction region;
   a reactant input, mounted with the reaction chamber, for supplying a flow of reactants into the reaction region;
   a support structure for supporting a workpiece within the reaction chamber;
   means, mounted within the reaction chamber and coupled to the support structure, for rotating and translating the workpiece, including
   a shaft inside the reaction chamber,
   a rotary feedthrough, coupled to the shaft, for feeding rotational motion into the reaction chamber to induce a rotational velocity of the shaft,
   a sleeve, mounted over the shaft and coupled to the support structure,
   engaging means, coupled to the shaft and to the sleeve, for providing an engaging force between the sleeve and the shaft so that normally the sleeve and the support structure achieve respective rotational velocities in response to the rotational velocity of the shaft,
   controllable means, coupled to the sleeve and controllable from outside the reaction chamber, for overcoming the engaging force between the sleeve and the shaft to inhibit rotation of the sleeve, and
   translating means, coupled to the shaft and the sleeve, for translating a difference in the rotational velocities of the sleeve and the shaft into translating motion of the support structure; and
   a pump, having a port on the reaction chamber between the reaction region and the means for rotating and translating, for pumping exhaust gases from the reaction region and gas-born particles released by the means for rotating and translating, out of the reaction chamber.

18. The apparatus of claim 17, wherein the engaging means comprises a frictional coupling.

19. The apparatus of claim 18, wherein the frictional coupling comprises a shaft seal.

20. The apparatus of claim 17, wherein the controllable means includes means for mechanically engaging the sleeve to prevent rotation of the sleeve.

21. The apparatus of claim 17, wherein the translating means includes threads on the shaft and matching threads on the sleeve.

22. The apparatus of claim 17, further including a seal on the translating means to prevent particles from escaping into the reaction chamber.

23. The apparatus of claim 17, wherein the engaging means comprises a frictional coupling which seals the translating means to prevent particles from escaping into the reaction chamber.

24. The apparatus of claim 23, wherein the frictional coupling comprises a shaft seal.

25. The apparatus of claim 17, wherein the translating means provides a range of translation having an end, and wherein at the end of the range of translation the shaft disengages from the sleeve for removal of the sleeve and support structure from the reaction chamber.

26. A reduced-pressure reaction apparatus, comprising:

a reaction chamber including a reaction region within the reaction chamber and having rigid walls;

an energy input, mounted with the reaction chamber, for supplying reaction energy into the reaction region;

a reactant input, mounted with the reaction chamber, for supplying a flow of reactants into the reaction region;

a support structure for supporting a workpiece within the reaction chamber;

means, mounted within the reaction chamber and coupled to the support structure, for rotating and translating the workpiece;

sealing means, mounted within the reaction chamber, for sealing the means for rotating and translating to reduce particles released into the reaction region; and a pump, having a port on the reaction chamber between the reaction region and the means for rotating and translating, for pumping exhaust gases from the reaction region and gas-born particles released by the means for rotating and translating, out of the reaction chamber.

27. The apparatus of claim 26, wherein the means for rotating and translating includes:

a shaft inside the reaction chamber;

a feedthrough, coupled to the shaft, for feeding motion into the reaction chamber to induce a rotational velocity of the shaft;

a sleeve, mounted over the shaft and coupled to the support structure;

engaging means, coupled to the shaft and to the sleeve, for providing an engaging force between the sleeve and the shaft so that normally the sleeve and the support structure achieve respective rotational velocities in response to the rotational velocity of the shaft;

controllable means, coupled to the sleeve and controllable from outside the reaction chamber, for overcoming the engaging force between the sleeve and the shaft to inhibit rotation of the sleeve; and translating means, coupled to the shaft and the sleeve, for translating a difference in the rotational velocities of the sleeve and the shaft into translating motion of the support structure.

28. The apparatus of claim 27, wherein the translating means provides a range of translation having an end, and wherein at the end of the range of translation the shaft disengages from the sleeve for removal of the sleeve and support structure from the reaction chamber.

29. A reduced-pressure reaction apparatus, comprising:

a reaction chamber including a reaction region within the reaction chamber;

an energy input, mounted with the reaction chamber, for supplying reaction energy into the reaction region;

a reactant input, mounted with the reaction chamber, for supplying a flow of reactants into the reaction region;

a support structure for supporting a workpiece within the reaction chamber;

means, mounted within the reaction chamber and coupled to the support structure, for rotating and translating the workpiece; and cooling means, mounted within the reaction chamber, for cooling the means for rotating and translating to reduce formation of deposits on the means for rotating and translating.

30. The apparatus of claim 29, further including a pump, having a port on the reaction chamber between the reaction region and the means for rotating and translating, for pumping exhaust gases from the reaction region and gas-born particles released by the means for rotating and translating, out of the reaction chamber.

31. The apparatus of claim 29, wherein: the means for rotating and translating includes a shaft inside the reaction chamber;

a feedthrough, coupled to the shaft, for feeding motion into the reaction chamber to induce a rotational velocity of the shaft;

a sleeve, mounted over the shaft and coupled to the support structure;

engaging means, coupled to the shaft and to the sleeve, for providing an engaging force between the sleeve and the shaft so that normally the sleeve and the support structure achieve respective rotational velocities in response to the rotational velocity of the shaft;

controllable means, coupled to the sleeve and controllable from outside the reaction chamber, for overcoming the engaging force between the sleeve and the shaft to inhibit rotation of the sleeve; and translating means, coupled to the shaft and the sleeve, for translating a difference in the rotational velocities of the sleeve and the shaft into translating motion of the support structure; and the means for cooling includes means for supplying a flow of cooling fluid in heat flow communication with the shaft and sleeve.

32. The apparatus of claim 31, wherein the shaft includes a channel for receiving the flow of cooling fluid.

* * * * *